United States Patent [19]

Williamson

[11] Patent Number: 4,782,281

[45] Date of Patent: Nov. 1, 1988

[54] METHOD OF MEASURING THE PARAMETERS OF A RESONATOR

[75] Inventor: Roger J. Williamson, Harlow, Great Britain

[73] Assignee: STC plc, London, England

[21] Appl. No.: 25,947

[22] Filed: Mar. 16, 1987

[30] Foreign Application Priority Data

Apr. 16, 1986 [GB] United Kingdom ............... 8609311

[51] Int. Cl.⁴ ............................................. G01R 27/02
[52] U.S. Cl. .................... 324/57 Q; 324/56; 324/58 R
[58] Field of Search .................. 324/56, 57 Q, 58 R; 310/319

[56] References Cited

U.S. PATENT DOCUMENTS

| | | | |
|---|---|---|---|
| 3,832,631 | 8/1974 | Koga et al. | 324/57 Q X |
| 4,093,914 | 6/1978 | Peppiate et al. | 324/56 |
| 4,158,805 | 6/1979 | Ballato | 324/56 |

*Primary Examiner*—Reinhard J. Eisenzopf
*Assistant Examiner*—Robert W. Mueller
*Attorney, Agent, or Firm*—Lee & Smith

[57] ABSTRACT

The method of measuring a resonator such as a quartz crystal is to calculate its admittance from the voltage transfer function of a suitable network incorporating the resonator. This admittance can be expressed in the form of a circle. Two initial measurements are taken from which an approximate circle is calculated. This circle is used to calculate the optimum measurement positions for the subsequent curve fitting routines, those positions being symmetrically placed around the series resonance. Each measurement is an average of a number of samples. The deviation from this average as well as the deviation from the circle defined by previous measurements is used to monitor the measurement. All the parameters are calculated by least square curve fitting of the first the admittance circle and then the variation of phase around the circle with frequency.

3 Claims, 3 Drawing Sheets

METHOD OF MEASURING THE PARAMETERS OF A RESONATOR

BACKGROUND OF THE INVENTION

The invention relates to an improved method for the measurement of the parameters of a resonator, such as a quartz crystal.

When developing quartz crystals for use at UHF, current measuring methods have been found to be unsuitable. In addition they are slow. An object of the present invention is to provide an improved method of making such measurements.

BRIEF DESCRIPTION OF THE INVENTION

According to the present invention, there is provided a method of measuring the characteristics of a resonator such as a quartz crystal, which includes the installation of the resonator in a testing jig which acts as an interface between the measuring means and the resonator to be measured, thus calculating the admittance of the resonator from the voltage transfer function of the network which includes the resonator, which admittance is expressed graphically in the form of a circle, wherein two initial measurements of the transfer functions are effected from which an approximate admittance circle is calculated, wherein the circle is thus calculated is used to calculate optimum measurement positions for the subsequent curve-fitting routines, which positions are symmetrically placed around the series resonance position, and wherein the characterics are calculated by least square fitting of the admittance circle and then the variation of phase around the circle with frequency.

BRIEF DESCRIPTION OF THE DRAWINGS

Embodiments of the invention as applied to the measurement of the parameters of quartz crystal resonators will now be described with reference to the accompanying drawings, in which.

DESCRIPTION OF THE PREFERRED EMBODIMENT

The current standard method for measuring crystals is set out in IEC444 (adopted as BS9610), which is a compromise as it only measures the zero phase resonant frequency and its equivalent resistance. An accepted equivalent circuit of a crystal resonator given in FIG. 1 comprises a motional arm (L1, C1, R1) in parallel with a capacitance (C0), the static capacitance. The former is called the motional arm as it describes the physical motion of the crystal and the true series resonant frequency is given by $$fs = \frac{1}{2\pi \sqrt{L1 \cdot C1}}$$

If there was no C0, fs would be the same as the zero phase frequency. The effect of C0 is to increase the measured frequency. For higher frequency devices (either in fundamental or overtone mode) some form of C0 compensation is essential. Indeed there is no zero phase frequency if $4\pi fs\, C0.R1 > 1$.

For filter applications (and to predict the pulling power of a crystal in oscillator applications) the complete equivalent circuit has to be specified. Since there are four elements, at least that number of measurements are required. Traditionally this is done by measuring the admittance of a crystal on a bridge, the effect of C0 being eliminated by tuning it out. This is difficult and slow and has to be done at each frequency. Further, the calibration of a bridge is not simple.

Figure 3:
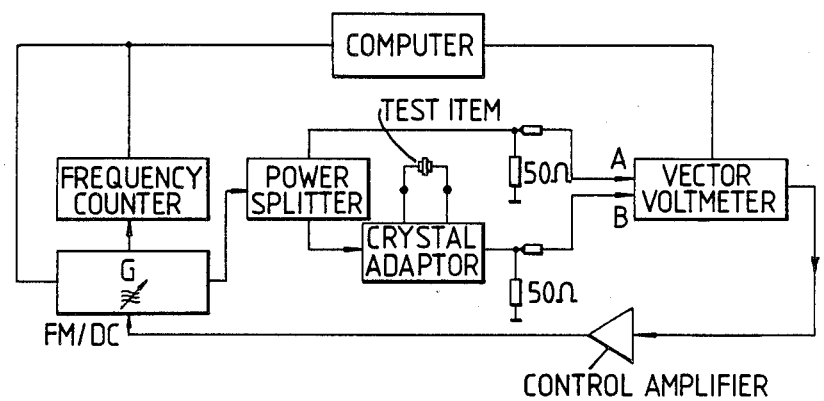
FIG. 3 is an example of a crystal measurement circuit.

Recently, network analysers designed to measure to GHz frequencies have been developed. They essentially consist of a frequency source and vector voltmeter which measures both voltage and phase, and is controllable by a microcomputer. Typically, the output of the frequency source is power split into two lines, one used as a reference and the other passed through the network to be measured, FIG. 3. A significant recent advance is the improvement in microcomputers which enables the measurement to be automated and also the computation to be sophisticated using many frequencies, curve fitting techniques and the mathematical cancellation of both the effect of the jig as well as the C0. In short it is possible to compensate mathematically for C0.

Figure 1:
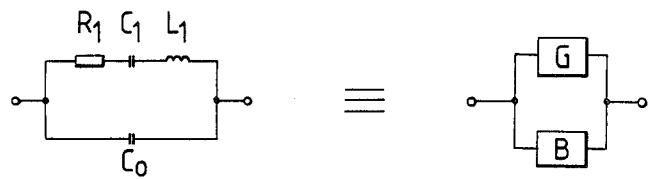
FIG. 1 shows an equivalent circuit of a crystal resonator.

The equivalent circuit, FIG. 1 is an approximation which is very accurate in most cases. At high frequencies the series inductance of the mounting wires and the stray capacitances to the can become more important. These can be included in the model but initially the simpler form is taken. In either case the circuit can be written in terms of admittance which takes the form of a circle, see the right of FIG. 1. Conductance G can be expressed mathematically as the real component of the admittance, with susceptance B the imaginary part. The concept of the admittance is a very important tool as it enables the physical operating condition of a crystal to be expressed graphically, G being plotted along the X axis and B along the Y axis.

In terms of the equivalent circuit the admittance can be written $$Y = \frac{[1 - wC0(wL1 - 1/wC1)] + jwC0 \cdot R1}{R1 + j(wL1 - 1/wC1)} \quad (1)$$

where $w = 2\pi.f$, and f is the frequency.
Rationalising:

$$G = \frac{R1}{R1^2 + (wL1 - 1/wC1)^2} \quad (2)$$

and $$B = \frac{-(wL1 - 1/wC1)}{R1^2 + (wL1 - 1/wC1)^2} + wC0 \quad (3)$$

These can be rewritten as $$(G - \tfrac{1}{2}R1)^2 + (B - wC0)^2 = \tfrac{1}{4}R1^2 \quad (4)$$

Figure 4:
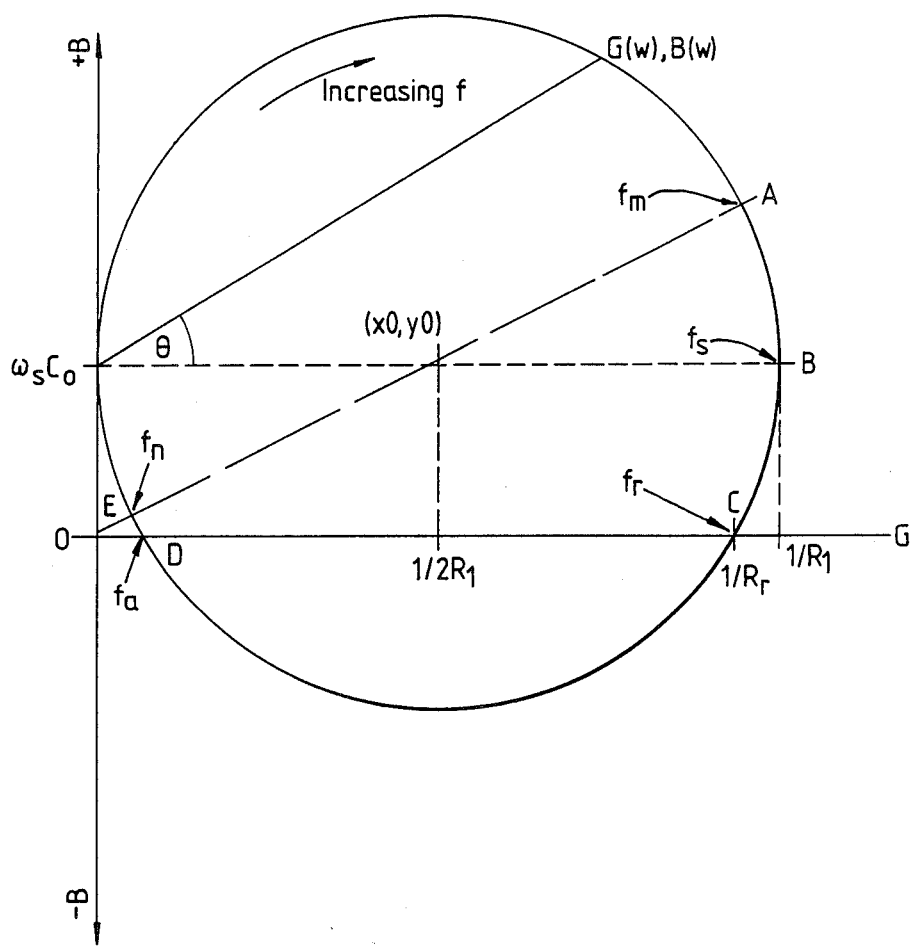
FIG. 4 is an explanatory diagram showing the locus of a crystal-unit transadmittance function in the Y plane, and definition of five characteristics frequencies.

This is a circle of radius $r = \frac{1}{2}R1$, FIG. 4, whose centre co-ordinates $(x0, y0)$ have values $\frac{1}{2}R1$ and $wC0$ respectively with frequency increasing clockwise. The advantage of using the admittance in expressing a crystal resonance is seen by describing the significance of the various points around the resonant circle. Point A, on the line through both the origin and the centre, corresponds to the maximum transmission as it has maximum admittance. Point B is the maximum value of G and is the true series resonance, and point C is where the crystal is purely resistive and hence corresponds to the zero phase frequency specified in IEC444. Thus the two most commonly measured frequencies lie on either side of the true resonance. Points D and E are the zero phase off resonance and the antiresonance respectively. R1 of FIG. 1 is given by the radius and the effect of C0 is to move the circle along the B axis. Thus mathematically it is simple to move the circle down so that the centre lies on the G axis.

Now that the C0 has been eliminated it is simple to calculate the other crystal parameters from the variation of frequency around the circle. Consider any point on the circle, such as point $G(w)$, $B(w)$ as shown in FIG. 4.

$$\tan(\theta) = B(w)/G(w) \quad (5)$$
$$= -(wL1 - 1/wC1)/R1$$

Now $ws.L1 = 1/ws.C0$ where $ws$ is the series resonance so $$\tan(\theta) = Q(ws^2 - w^2)/w.ws \quad (6)$$

where $$Q = 1/(ws.C1.R1) \quad (7)$$

To a very good approximation $$\tan(\theta) = 2Q(fs - f)/fs \quad (8)$$

This is linear so the gradient gives Q. We do not yet know fs, so we choose fref close to resonance and $$\tan(\theta) = a(fref - f) + b \quad (9)$$

where $$a = 2Q/fs \quad (10)$$

and $$b = 2Q(fs - fref)/fs \quad (11)$$

Hence fs is obtained from the intercept of the line with the axis.

In summary the complete equivalent circuit is $$fs = b/a + fref \quad (12)$$

$$Q = fs.a/2 \quad (13)$$

$$R1 = \frac{1}{2}r \quad (14)$$

$$C0 = y0/(fs/2\pi) \quad (15)$$

$$C1 = 1/(fs/2\pi.R1.Q) \quad (16)$$

$$L1 = 1/C1(2\pi fs) \quad (17)$$

where the centre of the admittance circle or radius r is at $(x0, y0)$ and a and b are the coefficients relating $\tan(\theta)$ with frequency around the circle.

There are a number of ways to measure the admittance of a crystal. The present method is to measure the voltage transfer function Vout/E of a network with two resistive matching pads joined by the crystal. If the equivalent circuit of the measuring jig can be accurately specified, no matter how complex, then so can the crystal. The network provides the resistance with which the crystal is compared, and also a buffer between the greatly varying impedance of the crystal and the measurement cable. Without such a buffer the variation of standing wave ratio of the jig would lead to serious errors.

Figure 2:
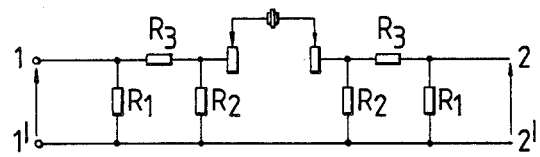
FIG. 2 is the circuit of an internationally accepted jig used to measure crystal parameters.

Such a jig is the international $\pi$ specified by IEC444, FIG. 2. In this $R1 = 159$ ohms, $R2 = 142$ ohms and $R3 = 68.2$ ohms. It consists of two 50 ohm to 12.5 ohm matching pads each with 14.8 dB of loss. However, there has been a move towards internationally accepted traceable coaxial standards of which the 50 ohm system is the most common. Since the effect of C0 is mathematically cancelled there is no need for the crystal to be loaded with a low impedance. Hence traceable coaxial 50 ohm attenuators can be the basis of the system. Indeed, if 15 dB 50 ohm attenuators are used the buffering effect is greater than with the IEC$\pi$.

Figure 5:
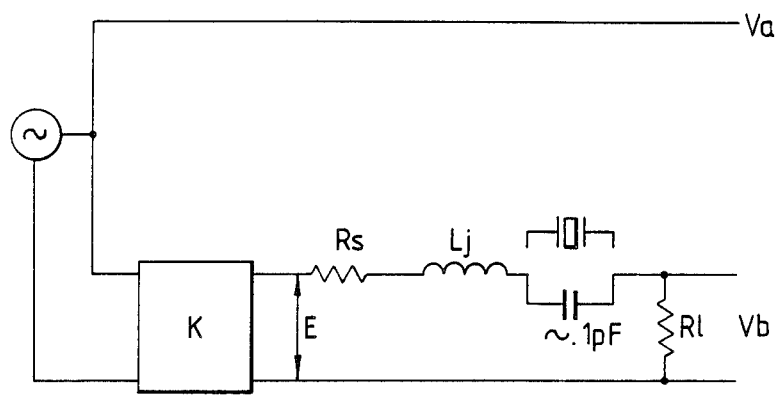
FIG. 5 is the equivalent circuit of the measurement jig.

For analysis the equivalent circuit of the jig, FIG. 5, has proved to be accurate up to 250 MHz for the IEC$\pi$. The series inductance is typically of the order of 5nH and is due in the main to the finite path length of the current loop of the crystal, load resistances and stray capacitances inherent in any measuring jig.

Generally $$Vb = V\text{real} + jV\text{imaginary} \quad (18)$$

but we measure $$|V| = (Vr^2 + Vi^2)^{\frac{1}{2}} \quad (19)$$

and $$\theta = \tan^{-1}(vi/Vr) \quad (20)$$

this gives $$Vi = |V| \sin\theta \text{ and } Vr = |V| \cos\theta \quad (21)$$

Now if Z is the total loop impedance and the crystal impedance is $Rx + jXx$ $$Z = R + jX = Rs + R1 + Rx + j(Xj + Xx) \quad (22)$$

and $$Vr + jVi = (R1/(R + jX)).E \quad (23)$$

But $E = Va.k$ where k is a constant so $$Vr + jVi = (R1/(R + jX)).Va.k \quad (24)$$

Equating real and imaginary parts and substituting $$R = Va/Vb \cos\theta.k.R1 \quad (25)$$

and $$X = -Va/Vb \sin\theta.k.R1 \quad (26)$$

The constant k can be found from a calibration using a known device in the place of the crystal. The simplest such device is a short and $$Z = R1 + Rs + jXj = Rj + jXj \text{ where } Rj = Rs + R1 \quad (27)$$

this gives $$k.R1 = (Vb/Va)_{cal}.(Rj^2 + Xj^2)^{\frac{1}{2}} \quad (28)$$

and $$\phi = \tan^{-1}(-Xj/Rj) \quad (29)$$

On calibration the phase difference between channels A and B is made zero, so that when a measurement is made with a crystal the measured phase is the difference between the actual phase and the calibration offset $\phi$. Substituting for Zx $$Rx = (Va/Vb)_m \cos(\theta_m + \phi).(Vb/Va)_{cal}(Rj^2 + Xj^2)^{\frac{1}{2}} - Rj \quad (30)$$

and $$Xx = -(Va/Vb)_m \sin(\theta_m + \phi).(Vb/Va)_{cal}(Rj^2 + Xj^2)^{\frac{1}{2}} - Xj \quad (31)$$

where $$\phi = \tan^{-1}(-Xj/Rj) \quad (32)$$

Finally using the usual series to parallel conversion $$Bx = -Xx/(Rx^2 + Xx^2) \quad (33)$$

and $$Gx = Rx/Rx^2 + Xx^2) \quad (34)$$

we have the admittance of the crystal.

Two curve fitting routines are required to calculate the crystal parameters. The first is for a circle of G(f), B(f) and the second is for the linear relationship between the phase and frequency around the circle. The latter is not described in detail as it is a standard least squares fit. An analytical solution can be obtained by minimising the sum of the squares of differences of the squares of the radii.

The equation of a circle is $$(xi - xo)^2 + (yi - yo)^2 - r^2 = 0 \quad (35)$$

or $$ri^2 - r^2 = 0 \quad (36)$$

where ri is the distance between xo,yo and xi,yi. For the $i^{th}$ data point therefore $$ri^2 - r^2 = \Delta i \quad (37)$$

which can be expanded as $$(ri - r)(ri + r) = \Delta i \quad (38)$$

in other words the difference is multiplied by a slowly changing variable whose effect on differentiation will be small.

$$\Delta i^2 = [(xi - xo)^2 + (yi - yo)^2 - r^2]^2 \quad (39)$$

and the three simultaneous equations required are derived from $$\epsilon_i d\Delta i^2/dr = 0 \quad (40)$$

$$\epsilon_i d\Delta i^2/dxo = 0 \quad (41)$$

$$\epsilon_i d\Delta i^2/dyo = 0 \quad (42)$$

After much substitution and simplification the equations become $$xo = (a.b + c.d)/2(c.e - a^2) \quad (43)$$

and $$yo = (a.d + e.b)/2(c.e - a^2) \quad (44)$$

$$r = [(\epsilon x^2 + \epsilon y^2 + n(xo^2 + yo^2) - 2(yo.\epsilon y + xo.\epsilon x)] \quad (45)$$

where $$a = (\epsilon xy - \epsilon x\epsilon y/n) \quad (46)$$

$$b = \epsilon y/n(\epsilon x^2 + \epsilon y^2) - \epsilon y^3 - \epsilon x^2 y \quad (47)$$

$$c = (\epsilon y)^2/n - \epsilon y^2 \quad (48)$$

$$d = \epsilon x/n(\epsilon x^2 + \epsilon y^2) - \epsilon x^3 - \epsilon y^2 x \quad (49)$$

$$e = (\epsilon x)^2/n - \epsilon x^2 \quad (50)$$

Figure 6:
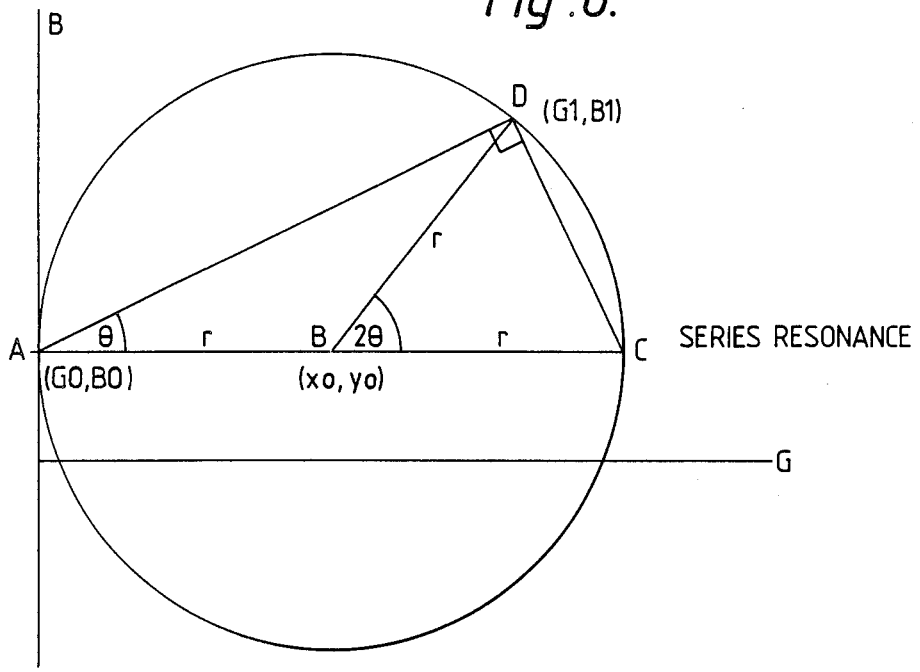
FIG. 6 is a diagram reference to calculation of points on a circle.

An important consideration is the number and location of the measurement points around the crystal resonance. The minimum number of points required to define a circle is three, but if the circle touches the B axis (r = xo) this becomes two. However, non-linearities and lead inductance move the circle from this point. So for maximum speed but minimum accuracy the points chosen could be used as in FIG. 6. Here a point on the circuit is found with an initial lock (D). The frequency is then taken down by 90% to measure the point A at which the circle touches the B axis. From these points the circle can be defined and used to find another point on the circle. For most crystals this can be the series resonance (C). In practice, C1 measured on many crystals depends on the phase at initial lock.

By taking measurements symmetrically around the true series resonance, deviations of both the circle and the phase/frequency line are minimised. Further the calculated parameters are less dependent on the phase range of the measurement. This makes sense since this is the area of maximum signal level and perhaps more importantly the point at which the crystal is used. Moreover, the effects of non-linearities are reduced as the amplitude variations are limited.

The measuring equipment uses a vector voltmeter and a voltage controlled oscillator pulled by the phase output of the voltmeter. The crystal resonance can be locked at different phases by altering the offset on this output. A synthesiser could be used in place of a VCO but it is easier to locate and scan a resonance in the phase domain. Thus it is necessary to calculate the lock-up phase for a given point on the circle if the measurements are to be symmetrically located about that circle, for which the circle must be specified. As mentioned, this can be done approximately using just two points, one somewhere on resonance (D) and the other just off resonance (A), see FIG. 6. Using simple trigonometry it can be shown that $$r = [G1^2 + (B1^2 - B0^2)]/2G1 \quad (51)$$

with centre at $x0 = r$ and $y0 = B0$. Consider the line BD from the centre of the circle to a point on it. Angle DBC is twice angle DAC and $$G = r(1 + \cos(2\theta)) = 2r \cos^2(\theta) \quad (52)$$

$$B = r \sin(2\theta) + B0 \quad (53)$$

By a parallel to series conversion $$Xx = -B/(B^2 + G^2) \text{ and } Rx = G/(B^2 + G^2) \quad (54)$$

the lock up phase is therefore $$\theta_{lock} = \tan^{-1}(-Xx + Xj)/Rx + Rj)) - \phi \quad (55)$$

where $\phi$ is the calibration phase as before.

The procedure is to calculate the approximate circle from a measurement of B0 off resonance and then at an initial lock point. Using this data, the lock up phases for the required measurement points are determined. As mentioned, the points should lie symmetrically about the resonance.

The true series resonance is at $\theta = 0$, so the simplest 3 point measurement can be made on a crystal by locking on this point.

$$\theta_{res} = \tan^{-1}((B0 - Xj(B0^2 + 4r^2))/(2r + Rj(B0^2 + 4r^2))) - \phi \quad (56)$$

However, this should not be relied on since if the crystal ESR R1 is greater than $1/w^2Rj.C0^2$ then no lock is possible at the series resonance.

If a synthesiser is used instead of a VCO (which could be a synthesiser with a DC/FM facility) then the problem of locking onto required points on the circle disappears. However, calculating the measurement positions around the crystal resonance in the frequency domain is more difficult than in the phase domain. It would require three preliminary points on the circle to estimate the rate of change of phase with frequency. Ideally a synthesiser with FM/DC facility would give the best of both worlds.

There are sources of errors in any measuring circuit. Instrumentation errors in measuring the phase and voltage accurately have two sources, systematic and fluctuating. The former can be minimised by regular calibration of the vector voltmeter. The latter, however, has two causes, noise and A/D resolution. Both of these can be improved by taking an average of a number of samples at each measurement point. There are however, three other potential sources of error that will be treated.

The equivalent circuit of FIG. 1 is accurate for most crystals, but a fuller equivalent circuit which includes both stray capacitance to the can and series inductance in the mount can also be used. In the present system the shunt capacitance is included in the C0, and the effect of series inductance is to pull the resonance. An analysis of the effect of a series impedance on the admittance circle shows that it causes well defined changes. The circle gets smaller as the reactance goes from inductive to capacitive. As the resistance increases the circle moves away from the ordinate.

Another error source is the impedance mismatch between the resistive network and the coaxial lines as the crystal impedance varies. This causes varying reflection at that interface. So long as the cable is correctly terminated at the instrument end, then no error results. Small mismatches here can be reduced by reducing the reflection coefficient of the measuring network. Thus in respect of resistance mismatch the IEC is not very good on its own reaching 53 ohms or 3% reflection coefficient. The insertion of a 8 dB 50 ohm attenuator in front of it improves the reflection coefficient to less than ½%. The disadvantage of this is that the loss of such a network is 38 dB plus the loss from the crystal impedance.

Other networks considered use 15 dB and 20 dB 50 ohm attenuators, which have the advantage of being readily available in a coaxial form that can be calibrated against known standards. They also have an advantage over the IEC in that for the 15 dB the buffering action is greater and the added loss from the crystal impedance is less by about 10 dB over the usual range. Furthermore, being coaxial a measurement jig made from them is compact, so the equivalent circuit is more accurately defined.

The above analysis of the measurement of a crystal is for a single resonance. In practice most crystals have a number of inharmonic resonances just above the main mode. If a full admittance circle were to be plotted then the other resonances would produce their own circles. Some means of checking that each successive data point lies on the same admittance circle is thus needed. Since the circle radius can be calculated from B0 and one data point on resonance the radius can be used as one check. However, it is possible to have two nearby resonances with similar radii. It was therefore found necessary to include the frequency of the measurement as a second check.

The mathematical operations occur under control of a main program which consists of a REPEAT:UNTIL loop which drives a menu of options.

The first procedure sets up the parameters and then sets the start and stop frequencies. These are the frequency limits of the sweep used to search for a response and are set 10% either side of the expected frequency. The user is also prompted to insert a short to determine the expected ESR. The calculated drive level is displayed on the screen so the level can be adjusted. Finally, a calibration is taken.

The next and main section measures as many crystals as required. Within it the first procedure, calls an "admit" procedure which calculates G and B. Initially the crystal is at the start frequency so G0 and B0 are calculated. The VCO is then allowed to sweep up in frequency till it locks on the preset initial phase and G1,B1 are measured. If no lock is achieved the initial lock angle is incremented and the sweep is restarted. If, after repeated attempts, the phase has reached the phase measured at G0,B0, the procedure is terminated and "no lock" is printed. If lock is achieved the approximate circle is calculated and the start, end, and series resonant phases are calculated together with the step necessary for the preset number of points. The present program also plots the admittance so it first plots the axes and calculates the scaling factors in "scales".

Returning to the main portion the crystal data is gathered in "measure" where the summation variables are zeroed. Next, within a REPEAT:UNTIL loop, the locking phase is stepped from the start to stop phase measuring the admittance at each point if lock is achieved. The current data is checked for radius and frequency at "check" which allows a repeat measurement if in doubt. If the data is good then a procedure is called which adds the data to the running total and plots the point on the screen. If no lock is achieved and if there are insufficient points the phase stepping is taken back to the start plus half a step and the process repeated. If there are enough then the loop is terminated. If the number of points at the end of the loop is less than 3 then the data collected initially is also used.

Next we have the routine that calculates the circle, substrate B0 from the ordinates (thus eliminating C0), and calculates the best fit for tan ($\theta$) with frequency. From this it calculates the crystal parameters and the standard deviation of the circle and line. On returning to the main routine the deviations of the individual points are plotted and finally printed. Here the calculated parameters are first formatted into a string array since in this form they take less space.

Other facilities in the program are the means of tabulating the results of a batch of crystals and storing them for use in a histogram program. Old files can be retrieved in "oldfile" and the initial values including the jig parameters can be edited in "values".

Single crystals are not the only devices that can be measured by their admittance circle. Duals (two acoustically coupled resonators), which are an essential component of many filters, can also be measured. In this case two circles must be measured, one for each natural resonance. At present the characterisation of such devices is even more difficult and unsatisfactory than of single resonators. To measure a dual it is necessary to make an earth contact to the centre pin so a modification to the jig is required. This modification is necessary in any case if the shunt capacitance to the crystal can is to be measured. At present the crystal is measured with the can floating.

I claim:

1. A method of measuring parameters including resonant frequency of a resonator, which includes:
    installing the resonator to be measured in a testing jig which acts as an interface between the resonator to be measured and measuring means;
    calculating the admittance of the resonator from the voltage transfer functions of the network which includes the resonator, which admittance is expressed in the form of a circle;
    effecting initial measurements of the transfer function from which an approximate admittance circle is calculated;
    using the circle as thus calculated to calculate optimum measurement positions for subsequent curve-fitting routines, which positions are symmetrically located around a series resonance position for the resonator; and
    calculating the parameters of the resonator by least square fitting of the admittance circle and then the variation of phase or admittance around the circle with frequency.

2. A method as claimed in claim 1, wherein said calculations of the transfer functions involve:
    measurement of susceptance B0 off resonance and susceptance at an initial lock point, the circle when thus calculated being tangential to the B axis; and
    said measurements being made in respect of points which are symmetrically disposed with respect to the resonance.

3. A method as claimed in claim 1, wherein the resonator whose characteristics to be measured is a dual formed by two resonators which are acoustically and electrically coupled, in which case two circles are measured, one for each said resonator's natural resonance, and wherein during the measurements a common point between the two resonators is grounded.

* * * * *